United States Patent
Khatri et al.

(10) Patent No.: US 8,913,976 B2
(45) Date of Patent: Dec. 16, 2014

(54) AMPLIFIERS WITH SHUNT SWITCHES

(71) Applicant: QUALCOMM Incorporated, San Diego, CA (US)

(72) Inventors: Himanshu Khatri, Laguna Niguel, CA (US); Ojas M Choksi, San Diego, CA (US); Wei Zhuo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/658,607

(22) Filed: Oct. 23, 2012

(65) Prior Publication Data

US 2014/0113573 A1    Apr. 24, 2014

(51) Int. Cl.
*H04B 1/10*    (2006.01)

(52) U.S. Cl.
USPC ............ 455/287; 455/67.11; 455/78; 455/73; 455/552.1

(58) Field of Classification Search
CPC .................................................... H03F 1/0277
USPC ......... 455/287, 67.11, 78, 73, 552.1
See application file for complete search history.

(56) References Cited

U.S. PATENT DOCUMENTS

| | | | |
|---|---|---|---|
| 6,751,470 B1 * | 6/2004 | Ella et al. ................ | 455/552.1 |
| 6,774,684 B2 * | 8/2004 | Wu et al. .................. | 327/134 |
| 6,864,746 B2 | 3/2005 | Cheah et al. | |
| 7,383,024 B2 | 6/2008 | Mueller et al. | |
| 7,714,657 B2 | 5/2010 | Wu | |
| 7,756,486 B1 | 7/2010 | Tan et al. | |
| 7,801,556 B2 | 9/2010 | Tran | |
| 8,120,428 B2 | 2/2012 | Montalvo et al. | |
| 8,229,367 B2 | 7/2012 | Chan et al. | |
| 8,232,850 B2 * | 7/2012 | Rofougaran ............. | 333/25 |
| 2003/0112065 A1 | 6/2003 | Brown et al. | |
| 2007/0060066 A1 | 3/2007 | Srinivasan | |
| 2008/0211582 A1 | 9/2008 | Lin | |
| 2008/0224770 A1 * | 9/2008 | Kim et al. ................ | 330/51 |
| 2010/0289579 A1 * | 11/2010 | Cassia et al. ............. | 330/251 |
| 2011/0176245 A1 * | 7/2011 | Worley et al. ............ | 361/56 |

FOREIGN PATENT DOCUMENTS

JP        2006050074 A     2/2006
WO    WO-2008145604 A1    12/2008

OTHER PUBLICATIONS

International Search Report and Written Opinion—PCT/US2013/066234—ISA/EPO—Dec. 4, 2013.

\* cited by examiner

*Primary Examiner* — Sanh Phu
(74) *Attorney, Agent, or Firm* — James Gutierrez (57) ABSTRACT

Amplifiers with shunt switches to mitigate interference are disclosed. In an exemplary design, an apparatus includes an amplifier and a shunt switch. The amplifier has an input operatively coupled to an input/output (I/O) pad of an integrated circuit (IC) chip. The shunt switch grounds the amplifier when the shunt switch is closed. The shunt switch is isolated from the I/O pad and the amplifier input. The amplifier may be a low noise amplifier (LNA) or some other type of amplifier. In an exemplary design, the shunt switch is isolated from the I/O pad by a series switch. The series switch and the shunt switch may be closed when the amplifier is disabled and may be opened when the amplifier is enabled.

18 Claims, 11 Drawing Sheets

FIG. 11

AMPLIFIERS WITH SHUNT SWITCHES

BACKGROUND

I. Field

The present disclosure relates generally to electronics, and more specifically to amplifiers.

II. Background

Amplifiers are commonly used in various electronic devices to provide signal amplification. Different types of amplifiers are available for different uses. For example, a wireless communication device such as a cellular phone may include a transmitter and a receiver for bi-directional communication. The receiver may include a low noise amplifier (LNA), the transmitter may include a driver amplifier (DA) and a power amplifier (PA), and the receiver and transmitter may include variable gain amplifiers (VGAs).

A wireless device may include a number of LNAs to support different frequency bands, different radio technologies, etc. Only a subset of the LNAs may be enabled at any given moment, and the remaining LNAs may be disabled to conserve battery power. The disabled LNAs should not adversely impact the performance of the wireless device.

BRIEF DESCRIPTION OF THE DRAWINGS

FIGS. 5 to 8B show some exemplary designs of LNAs with shunt switches.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Amplifiers with shunt switches are disclosed herein. These amplifiers may be used for various electronic devices such as wireless communication devices (e.g., cellular phones, smartphones, etc.), tablets, personal digital assistants (PDAs), handheld devices, wireless modems, laptop computers, smartbooks, netbooks, cordless phones, wireless local loop (WLL) stations, Bluetooth devices, consumer electronic devices, etc. For clarity, the use of amplifiers with shunt switches for a wireless communication device is described below.

Figure 1:
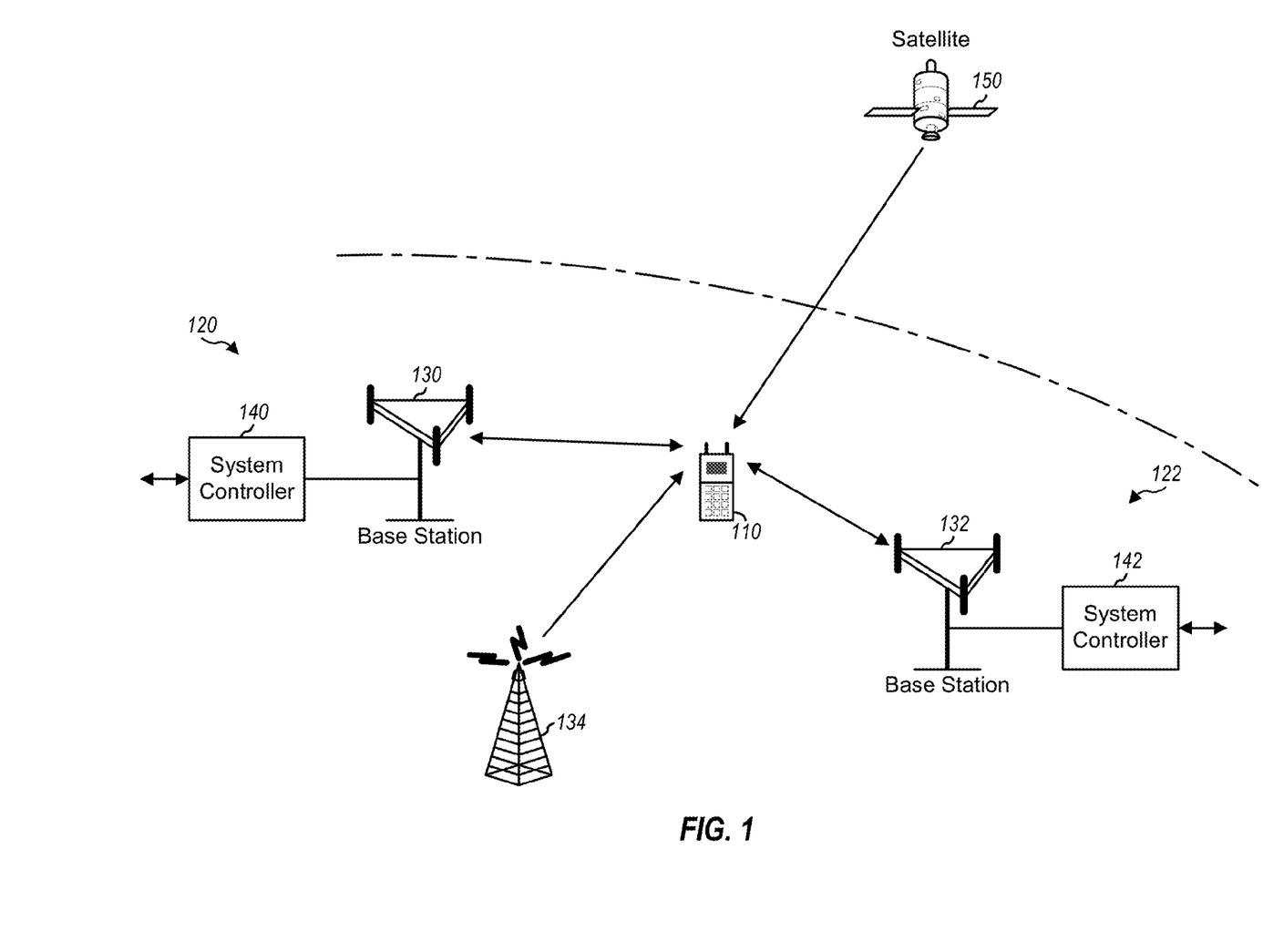
FIG. 1 shows a wireless device communicating with wireless systems.

FIG. 1 shows a wireless device 110 capable of communicating with different wireless communication systems 120 and 122. Wireless systems 120 and 122 may each be a Code Division Multiple Access (CDMA) system, a Global System for Mobile Communications (GSM) system, a Long Term Evolution (LTE) system, a wireless local area network (WLAN) system, or some other wireless system. A CDMA system may implement Wideband CDMA (WCDMA), CDMA 1x, Time Division Synchronous CDMA (TD-SCDMA), or some other version of CDMA. For simplicity, FIG. 1 shows wireless system 120 including one base station 130 and one system controller 140, and wireless system 122 including one base station 132 and one system controller 142. In general, each wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, a consumer electronic device, etc. Wireless device 110 may be capable of communicating with wireless system 120 and/or 122. Wireless device 110 may also be capable of receiving signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, TD-SCDMA, GSM, IEEE 802.11, etc.

Figure 2:
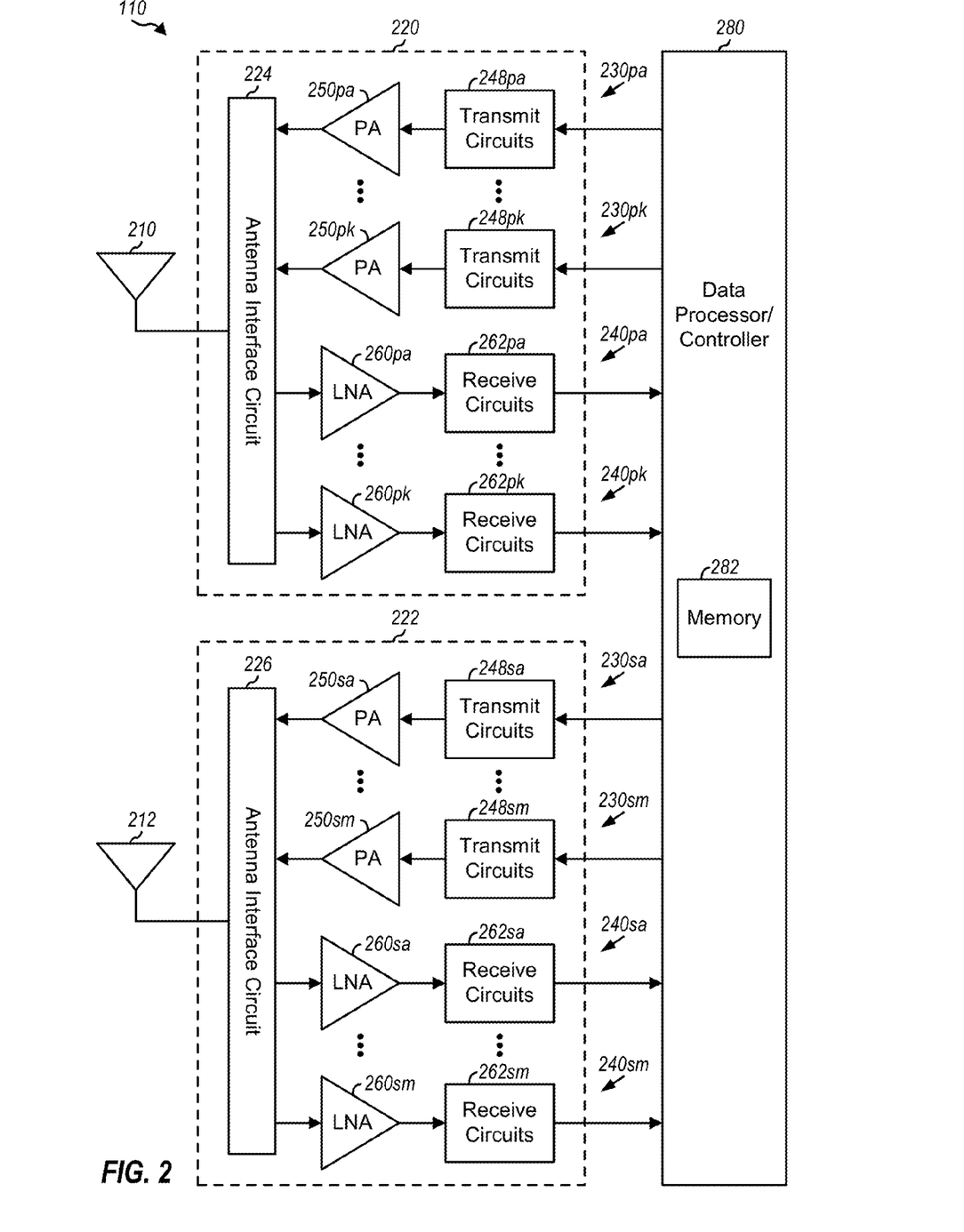
FIG. 2 shows a block diagram of the wireless device in FIG. 1.

FIG. 2 shows a block diagram of an exemplary design of wireless device 110 in FIG. 1. In this exemplary design, wireless device 110 includes a transceiver 220 coupled to a primary antenna 210, a transceiver 222 coupled to a secondary antenna 212, and a data processor/controller 280. Transceiver 220 includes multiple (K) transmitters 230pa to 230pk and multiple (K) receivers 240pa to 240pk to support multiple frequency bands, multiple radio technologies, carrier aggregation, etc. Transceiver 222 includes M transmitters 230sa to 230sm and M receivers 240sa to 240sm to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each transmitter 230 includes transmit circuits 248 and a power amplifier (PA) 250. For data transmission, data processor 280 processes (e.g., encodes and modulates) data to be transmitted and provides an analog output signal to a selected transmitter. The description below assumes that transmitter 230pa is the selected transmitter. Within transmitter 230pa, transmit circuits 248pa amplify, filter, and upconvert the analog output signal from baseband to radio frequency (RF) and provide a modulated RF signal. Transmit circuits 248pa may include amplifiers, filters, mixers, matching circuits, an oscillator, a local oscillator (LO) generator, a phase locked loop (PLL), etc. A PA 250pa receives and amplifies the modulated RF signal and provides a transmit RF signal having the proper output power level. The transmit RF signal is routed through an antenna interface circuit 224 and transmitted via antenna 210. Antenna interface circuit 224 may include switches, duplexers, diplexers, transmit filters, receive filters, matching circuits, a directional coupler, etc. Each remaining transmitter 230 in transceivers 220 and 222 may operate in similar manner as transmitter 230pa.

In the exemplary design shown in FIG. 2, each receiver 240 includes an LNA 260 and receive circuits 262. For data reception, antenna 210 receives signals from base stations and/or other transmitter stations and provides a received RF signal, which is routed through antenna interface circuit 224 and provided to a selected receiver. The description below assumes that receiver 240pa is the selected receiver. Within receiver 240pa, LNA 260pa amplifies the received RF signal and provides an output RF signal. Receive circuits 262pa downconvert the output RF signal from RF to baseband, amplify and filter the downconverted signal, and provide an analog input signal to data processor 280. Receive circuits 262pa may include mixers, filters, amplifiers, matching circuits, an oscillator, an LO generator, a PLL, etc. Each remaining receiver 240 in transceivers 220 and 222 may operate in similar manner as receiver 240pa.

FIG. 2 shows an exemplary design of transmitter 230 and receiver 240. A transmitter and a receiver may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, transmit circuits 248, LNAs 260, and receive circuits 262 and may be implemented on one module, which may be an RFIC, etc. Antenna interface circuits 224 and 226 may be implemented on another module, which may be a hybrid module, etc. PAs 250 may be implemented on an RFIC with LNAs 260 or a module with antenna interface circuits 224 and 226. The circuits in transceivers 220 and 222 may also be implemented in other manners.

Data processor/controller 280 may perform various functions for wireless device 110. For example, data processor 280 may perform processing for data being transmitted via transmitters 230 and data being received via receivers 240. Controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

Wireless device 110 may be able to operate in low-band from 698 to 960 megahertz (MHz), mid-band from 1475 to 2170 MHz, and/or high-band from 2300 to 2690 and 3400 to 3800 MHz. Low-band, mid-band, and high-band refer to three groups of bands (or band groups), with each band group including a number of frequency bands (or simply, "bands").

Wireless device 110 may support a number of bands. Each band may be used for frequency division duplexing (FDD) or time division duplexing (TDD). Each band used for FDD is associated with (i) a first frequency range for transmission on the uplink from wireless devices to base stations, which may be referred to as a transmit range, and (ii) a second frequency range for transmission on the downlink from base stations to wireless devices, which may be referred to as a receive range. The transmit and receive ranges are from the perspective of a wireless device.

Table 1 lists some bands that may be supported by wireless device 110 and also provides the transmit range (Uplink/TX) and the receive range (Downlink/RX) for each band. As shown in Table 1, the transmit range of one band may overlap the receive range of another band. For example, the transmit range of 1920 to 1980 MHz for IMT-2000 band overlaps the receive range of 1930 to 1990 MHz for PCS band. Two bands may be considered as overlapping bands if the transmit range of one band overlaps the receive range of another band. In such a scenario, a transmit RF signal from a transmitter for one band may cause interference to a receiver for that band due to insufficient isolation between receivers, as described below.

TABLE 1

| Frequency Band | Uplink/TX (MHz) | Downlink/RX (MHz) |
| --- | --- | --- |
| IMT-2000 | 1920-1980 | 2110-2170 |
| PCS | 1850-1910 | 1930-1990 |
| DCS | 1710-1785 | 1805-1880 |
| Cellular/GSM 850 | 824-849 | 869-894 |
| GSM 900 | 890-915 | 935-960 |

Figure 3:
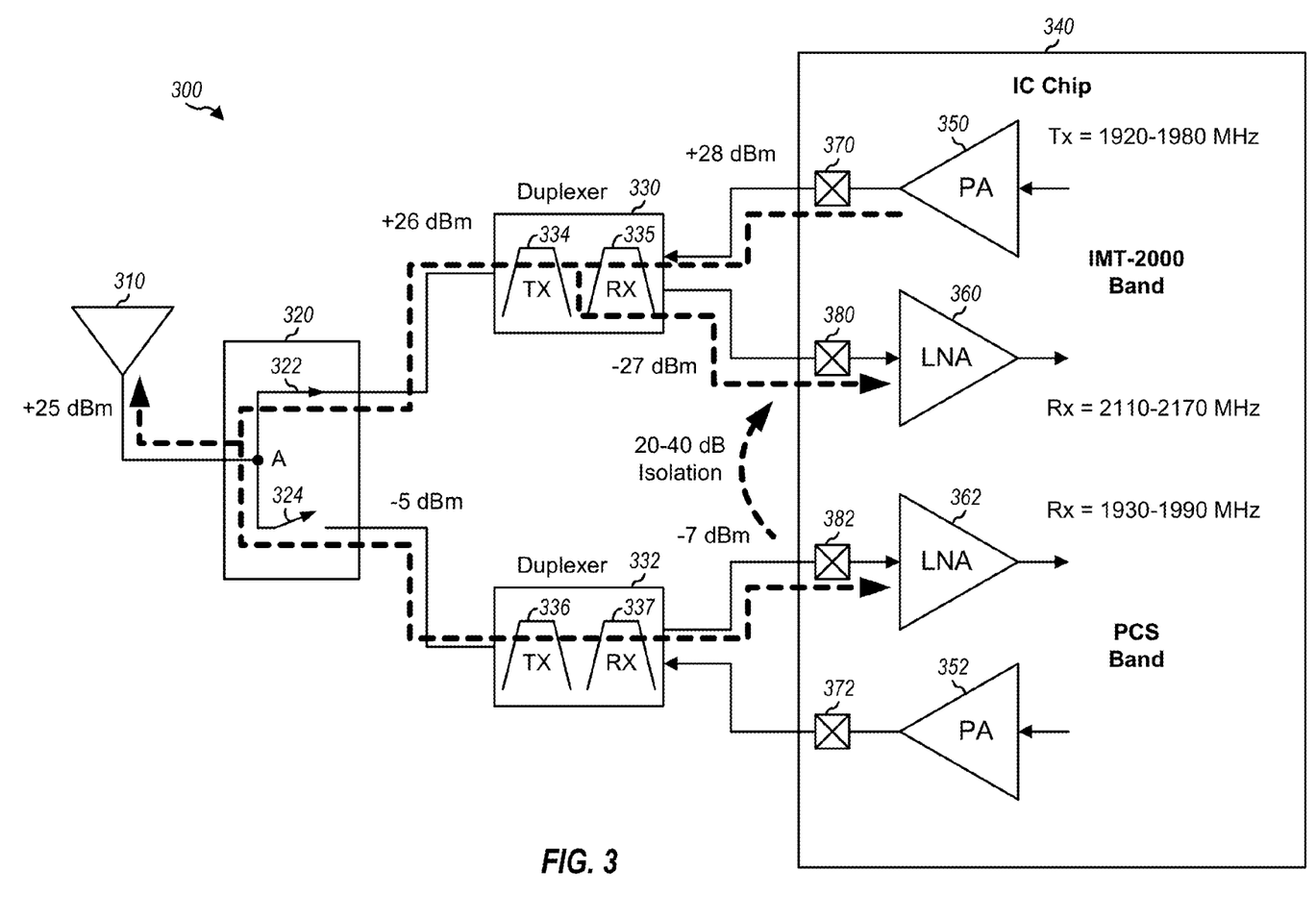
FIG. 3 shows interference due to overlapping bands and insufficient isolation between receivers.

FIG. 3 shows an example of interference due to overlapping bands and insufficient isolation between receivers. In this example, a wireless device 300 includes (i) an antenna 310, (ii) a switchplexer 320, (iii) a duplexer 330, a PA 350, and an LNA 360 for IMT-2000 band, and (iv) a duplexer 332, a PA 352, and an LNA 362 for PCS band. Switchplexer 320 includes (i) a switch 322 coupled between node A and duplexer 330 and (ii) a switch 324 coupled between node A and duplexer 332. Antenna 310 is coupled to node A. Duplexer 330 includes a transmit (TX) filter 334 and a receive (RX) filter 335 for IMT-2000 band. Duplexer 332 includes a transmit filter 336 and a receive filter 337 for PCS band. PA 350 and LNA 360 are coupled to transmit filter 334 and receive filter 335, respectively, within duplexer 330 for IMT-2000 band. PA 352 and LNA 362 are coupled to transmit filter 336 and receive filter 337, respectively, within duplexer 332 for PCS band. PAs 350 and 352 and LNAs 360 and 362 are implemented on an IC chip 340 and are coupled to input/output (I/O) pads 370, 372, 380 and 382, respectively, on IC chip 340. I/O pads 370 to 382 may be coupled to solder balls or external pins of an IC package, which may have limited isolation (e.g., 40 decibels (dB) or less of isolation) between solder balls or external pins.

In the example shown in FIG. 3, PA 350 and LNA 360 for IMT-2000 band are enabled, and PA 352 and LNA 362 for PCS band are disabled. PA 350 provides a transmit RF signal at +28 dBm in order to obtain the highest required output power of +25 dBm at antenna 310. dBm is a ratio of measured power to 1 milliwatt in dB. The transmit RF signal is at +26 dBm after duplexer 330 due to 2 dB of insertion loss of transmit filter 334 and is at +25 dBm at antenna 310 due to 1 dB of insertion loss of closed switch 322.

Switch 324 has 30 dB of rejection when it is opened, and a portion of the transmit RF signal leaks through switch 324. The leaked transmit RF signal is at −5 dBm at the input of duplexer 332 due to 30 dB of rejection of switch 324. The passband of receive filter 337 for PCS band overlaps the passband of transmit filter 334 for IMT-2000 band, as shown in Table 1. Hence, the leaked transmit RF signal passes through receive filter 337 for the PCS band and is at −7 dBm at the input of LNA 362 due to 2 dB of insertion loss of receive filter 337. The isolation between I/O pads 380 and 382 may be 20 to 40 dB. A portion of the leaked transmit RF signal at the input of LNA 362 would then leak to the input of LNA 360, and this leaked RF signal may be at −27 to −47 dBm at the input of LNA 360.

Duplexer 330 has 55 dB of rejection between transmit filter 334 and receive filter 335. A portion of the transmit RF signal leaks from transmit filter 334 to receive filter 335, and the leaked transmit RF signal is at −27 dBm at the input of LNA 360.

As shown in FIG. 3, the leaked transmit RF signal at the input of LNA 362 may be relatively high (e.g., −7 dBm) due to (i) the finite isolation of switch 324 and (ii) the receive range of the PCS band overlapping the transmit range of the IMT-2000 band. Even though LNA 362 is turned off, relatively strong jammers may be coupled between I/O pads 380 and 382 and may result in desensitization of the receive path for the IMT-2000 band. A jammer is a large undesired signal.

In an aspect of the present disclosure, a shunt switch may be used to attenuate undesired signals at a disabled first LNA in order to reduce coupling of the undesired signals from the disabled first LNA to an enabled second LNA. The first LNA may be coupled to an I/O pad. In an exemplary design, the shunt switch may be isolated from the I/O pad via a first circuit, which may comprise a series switch and/or other circuit components. In an exemplary design, the shunt switch may be isolated from the input of the first LNA via a second circuit. The shunt switch has parasitic capacitance when it is turned off. This parasitic capacitance acts as a capacitive load that may degrade the sensitivity of the first LNA if the shunt switch and the first LNA input are both coupled directly to the I/O pad. Isolating the shunt switch from the I/O pad via the first circuit and from the first LNA input via the second circuit may mitigate degradation in sensitivity of the first LNA due to the parasitic capacitance of the shunt switch.

Figure 4A:
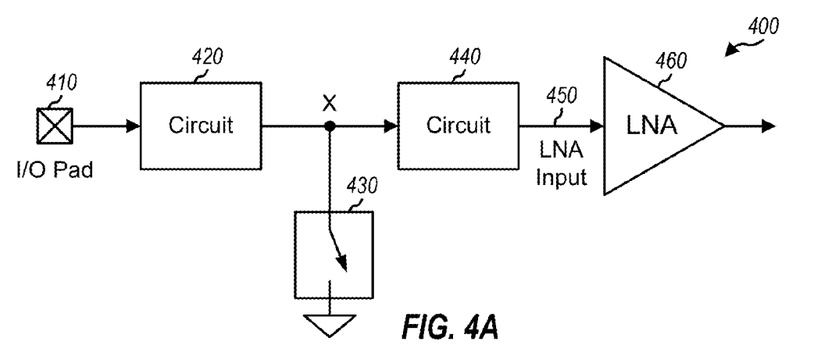
FIGS. 4A to 4D show four circuit topologies for an LNA with a shunt switch.

FIG. 4A shows a first circuit topology 400 for implementing a shunt switch 430 for an LNA 460. In the exemplary design shown in FIG. 4A, a circuit 420 is coupled between an I/O pad 410 and node X. Shunt switch 430 is coupled between node X and circuit ground. A circuit 440 is coupled between node X and an LNA input 450 of LNA 460. Circuits 420 and 440 may each be implemented in various manners, as described below. Shunt switch 430 is isolated from I/O pad 410 via circuit 420 and is isolated from LNA input 450 via circuit 440.

Figure 4B:
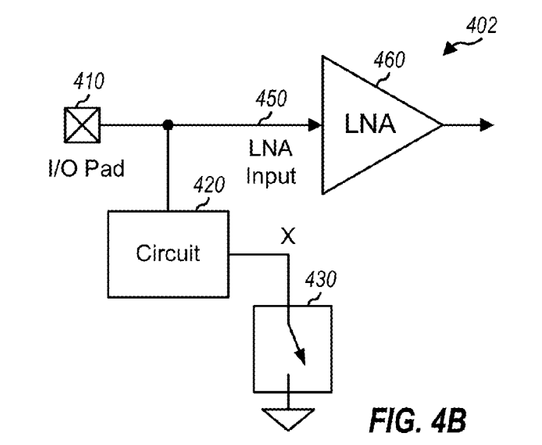

FIG. 4B shows a second circuit topology 402 for implementing shunt switch 430 for LNA 460. In the exemplary design shown in FIG. 4B, circuit 420 is coupled between I/O pad 410 and node X. Shunt switch 430 is coupled between node X and circuit ground. LNA 460 has its input coupled directly to I/O pad 410. Shunt switch 430 is isolated from I/O pad 410 via circuit 420 and is also isolated from LNA input 450 via circuit 420.

Figure 4C:
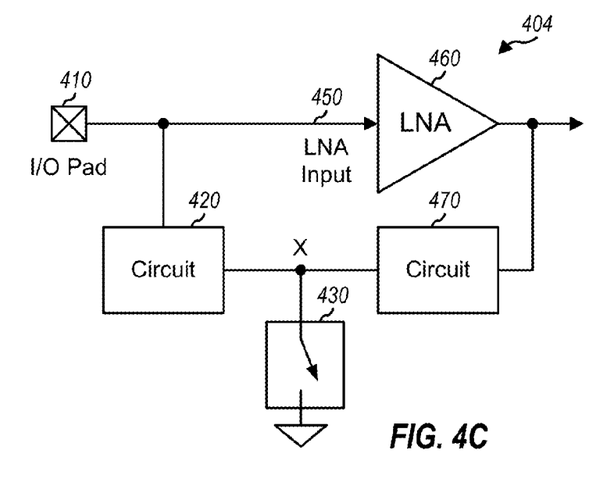

FIG. 4C shows a third circuit topology 404 for implementing shunt switch 430 for LNA 460. In the exemplary design shown in FIG. 4C, circuit 420 is coupled between I/O pad 410 and node X. Shunt switch 430 is coupled between node X and circuit ground. A circuit 470 is coupled between node X and the output of LNA 460. Circuit 470 may comprise another LNA, a feedback circuit, and/or some other circuit. The feedback circuit may include a resistor, a capacitor, a transistor, some other circuit component, or a combination thereof. LNA 460 has its input coupled directly to I/O pad 410. Shunt switch 430 is isolated from I/O pad 410 via circuit 420 and is also isolated from LNA input 450 via circuit 420.

Figure 4D:
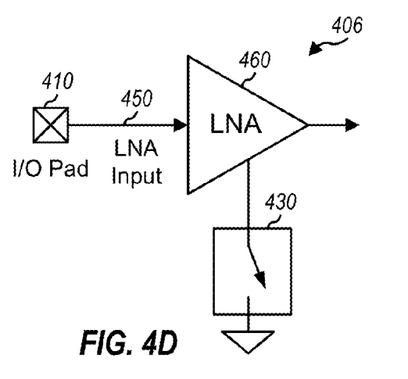

FIG. 4D shows a fourth circuit topology 406 for implementing shunt switch 430 for LNA 460. In the exemplary design shown in FIG. 4D. LNA 460 has its input coupled directly to I/O pad 410. Shunt switch 430 is coupled between an internal node of LNA 460 and circuit ground. Shunt switch 430 is isolated from I/O pad 410 via LNA 460 and is also isolated from LNA input 450 via LNA 460.

FIGS. 4A to 4D show four exemplary designs in which a shunt switch is isolated from an I/O pad via a first circuit and isolated from an LNA input via a second circuit. The second circuit may be different from the first circuit (e.g., as shown in FIG. 4A) or may be the same circuit as the first circuit (e.g., as shown in FIGS. 4B, 4C and 4D). A shunt switch may also be isolated from an I/O pad and an LNA input in other manners.

Figure 5:
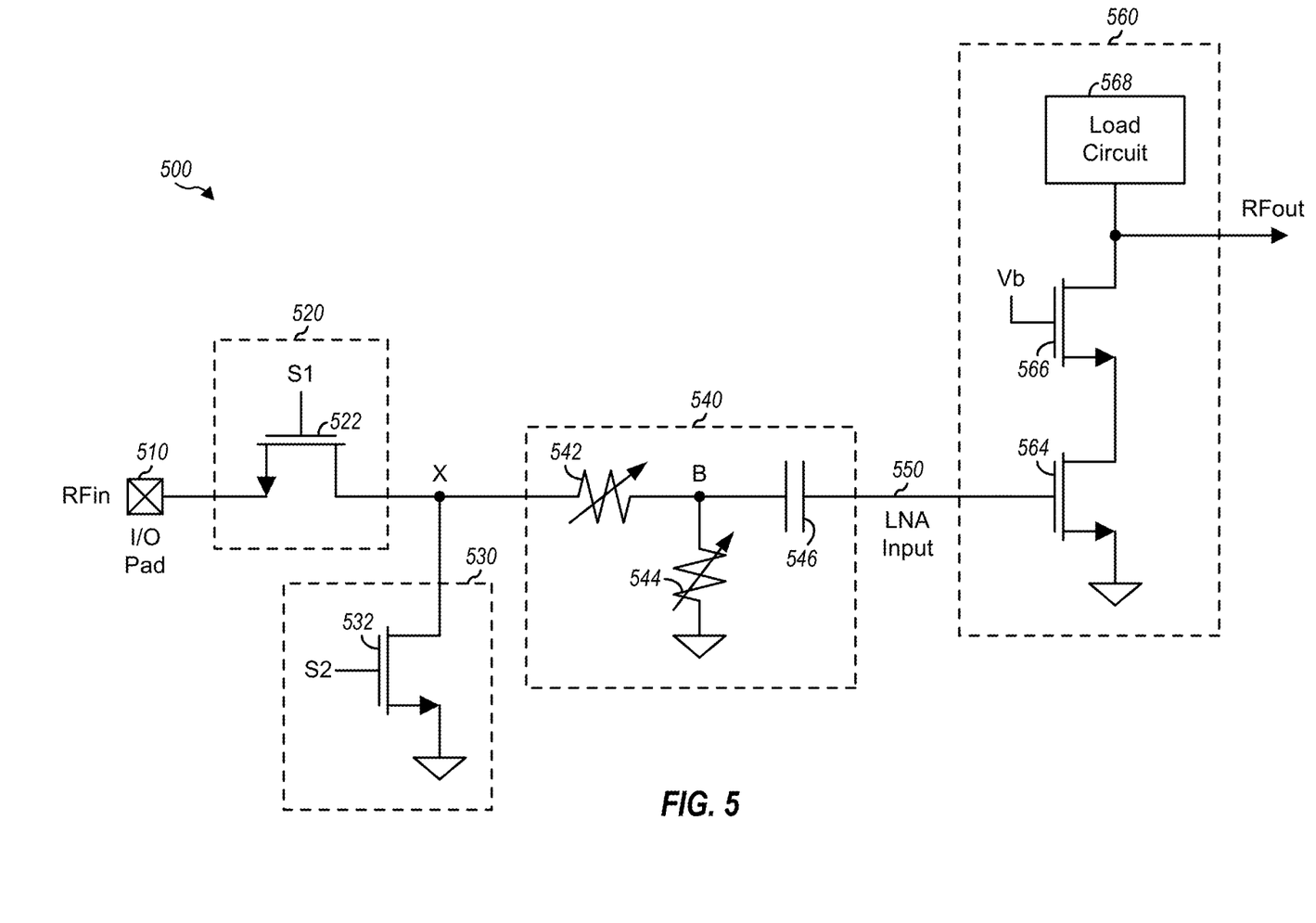

FIG. 5 shows an exemplary design of a receiver 500 that implements the first circuit topology in FIG. 4A. In the exemplary design shown in FIG. 5, a circuit 520 comprising an N-channel metal oxide semiconductor (NMOS) transistor 522 is coupled between an I/O pad 510 and node X. NMOS transistor 522 operates as a series switch and has its source coupled to I/O pad 510, its drain coupled to node X, and its gate receiving a S1 control signal. A shunt switch 530 implemented with an NMOS transistor 532 is coupled between node X and circuit ground. NMOS transistor 532 has its source coupled to circuit ground, its drain coupled to node X, and its gate receiving a S2 control signal.

A circuit 540 is coupled between node X and LNA input 550. In the exemplary design shown in FIG. 5, circuit 540 includes (i) a variable resistor 542 coupled between node X and node B, (ii) a variable resistor 544 coupled between node B and circuit ground, and (iii) an alternating current (AC) coupling capacitor 546 coupled between node B and LNA input 550. Resistors 542 and 544 may have their values adjusted to obtain the desired attenuation of an input RF signal received via I/O pad 510. Circuit 540 may also include only AC coupling capacitor 546 coupled between node X and LNA input 550 and/or other circuit components. Shunt switch 530 is isolated from I/O pad 510 via circuit 520 and is also isolated from LNA input 550 via circuit 540.

In the exemplary design shown in FIG. 5, LNA 560 includes a gain NMOS transistor 564, a cascode NMOS transistor 566, and a load circuit 568. Gain transistor 564 has its source coupled to circuit ground and its gate coupled to LNA input 550. Cascode transistor 566 has its source coupled to the drain of gain transistor 564, its gate receiving a Vb bias voltage, and its drain providing an output RF signal (RFout). Load circuit 568 is coupled between a power supply voltage and the drain of cascode transistor 566. AC coupling capacitor 546 enables gain transistor 564 to be biased with a proper bias voltage and allows shunt switch 530 to be closed without impacting the DC operation of LNA 560.

When LNA 560 is enabled, series switch 520 may be closed, and shunt switch 530 may be opened. LNA 560 may then amplify an input RF signal received via I/O pad 510 and provide an output RF signal. When LNA 560 is disabled, series switch 520 and shunt switch 530 may both be closed. The input RF signal may then be shorted to circuit ground via switches 520 and 530, which may reduce interference to another LNA that is enabled.

Figure 6:
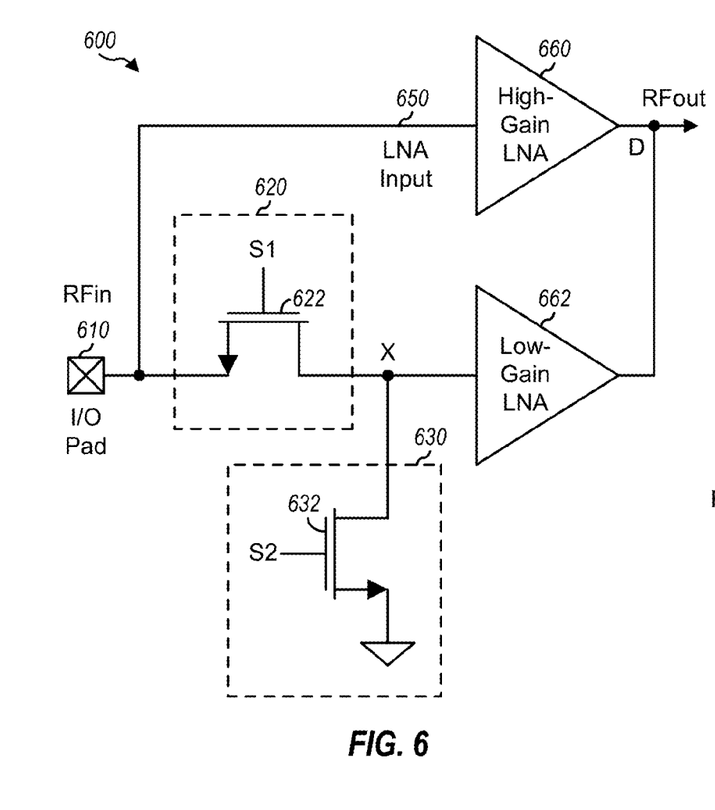

FIG. 6 shows an exemplary design of a receiver 600 that implements the second circuit topology in FIG. 4B and also the third circuit topology in FIG. 4C. In the exemplary design shown in FIG. 6, a circuit 620 comprising an NMOS transistor 622 is coupled between an I/O pad 610 and node X. A shunt switch 630 implemented with an NMOS transistor 632 is coupled between node X and circuit ground. A high-gain LNA 660 has its LNA input 650 coupled directly to I/O pad 610 and its output coupled to node D. A low-gain LNA 662 has its input coupled to node X and its output coupled to node D. Low-gain LNA 662 may be implemented with circuit 540 and LNA 560 in FIG. 5 or with some other LNA circuit design. High-gain LNA 660 may be implemented with a modified version of LNA 560, which includes a source degeneration inductor coupled between the source of NMOS transistor 564 and circuit ground. High-gain LNA 660 may also be implemented with LNA 560 or with some other LNA circuit design.

High-gain LNA 660 and low-gain LNA 662 may be used for a particular band K (e.g., PCS band) and may operate in one of three modes at any given moment. In a first mode, high-gain LNA 660 may be enabled and low-gain LNA 662 may be disabled when band K is selected and the input RF signal is sufficiently small, e.g., when the received power of the input RF signal is below a low threshold. In the first mode, series switch 620 may be opened, and shunt switch 630 may be closed. In a second mode, low-gain LNA 662 may be enabled and high-gain LNA 660 may be disabled when band K is selected and the input RF signal is not small. In the second mode, series switch 620 and shunt switch 630 may both be opened. In a third mode, high-gain LNA 660 and low-gain LNA 662 may both be disabled when band K is not selected. In the third mode, series switch 620 and shunt switch 630 may both be closed. The use of high-gain LNA 660 and low-gain LNA 662 for band K may improve performance and reduce power consumption across different input RF signal levels.

If shunt switch 630 is coupled directly at the input of high-gain LNA 660, then the sensitivity of LNA 660 may be degraded when shunt switch 630 is opened. Hence, shunt switch 630 may be placed at the input of low-gain LNA 662, after series switch 620. Shunt switch 630 is isolated from I/O pad 610 via series switch 620 and is also isolated from LNA input 650 via series switch 620.

Isolating shunt switch 630 from I/O pad 610 and LNA input 650 may provide various advantages. First, series switch 620 may have a relatively large size in order to obtain a low On resistance when series switch 620 is closed. Hence, a low resistance path from I/O pad 610 to circuit ground may be obtained via switches 620 and 630 when both switches are closed. This low resistance path to circuit ground may effectively attenuate undesired signals and filter out TX jammers when band K is not selected. Second, shunt switch 630 has parasitic capacitance at node X when it is opened, but this parasitic capacitance may have negligible impact on the performance of enabled LNA 660 or 662. Low-gain LNA 662 has lower sensitivity requirements since it is enabled when the input RF signal level is sufficiently strong. Low-gain LNA 662 may thus be able to handle the additional capacitive loading due to the parasitic capacitance of shunt switch 630 with negligible degradation to sensitivity and can meet its sensitivity requirements. The additional capacitive loading of shunt switch 630 is isolated from LNA input 650 via series switch 620 and may thus have negligible impact on the performance of high-gain LNA 660.

Figure 7:
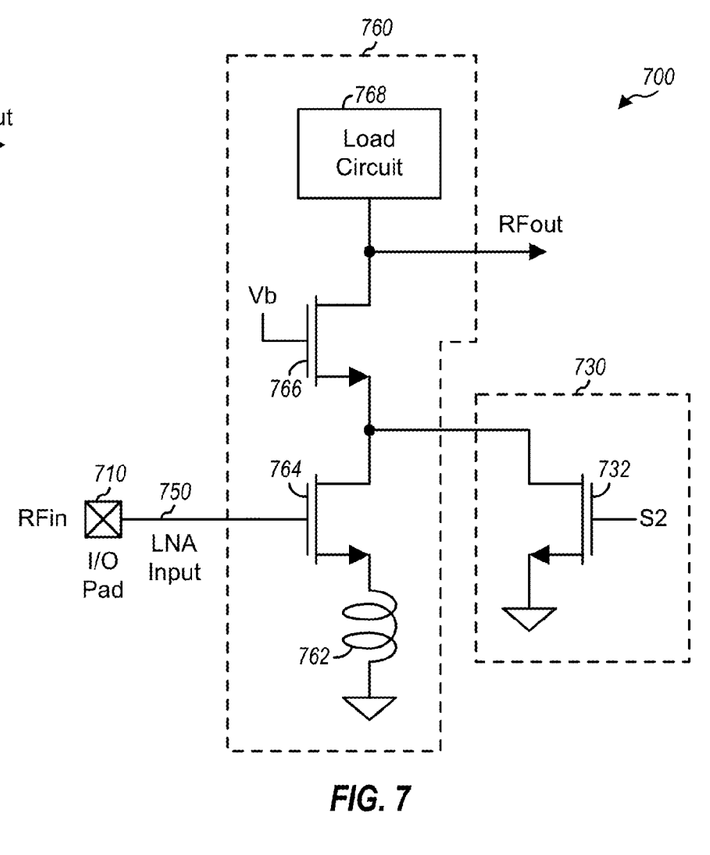

FIG. 7 shows an exemplary design of a receiver 700 that implements the fourth circuit topology in FIG. 4D. In the exemplary design shown in FIG. 7, an LNA 760 has its LNA input 750 coupled directly to an I/O pad 710 and its output providing an output RF signal. LNA 760 includes a source degeneration inductor 762, a gain NMOS transistor 764, a cascode NMOS transistor 766, and a load circuit 768, which are coupled as shown in FIG. 7. A shunt switch 730 implemented with an NMOS transistor 732 is coupled between the drain of gain transistor 764 and circuit ground. Shunt switch 730 is isolated from I/O pad 710 via LNA 760 and is also isolated from LNA input 750 via LNA 760.

In the exemplary design shown in FIG. 7, shunt switch 730 is coupled to the drain of gain transistor 764. This exemplary design may be used if source degeneration inductor 762 is not shared by two LNAs covering two overlapping bands (e.g., not shared by LNAs 360 and 362 in FIG. 3 for IMT-2000 and PCS bands). Shunt switch 730 may be opened when LNA 760 is enabled and may be closed when LNA 760 is disabled. Shunt switch 730 has parasitic capacitance when it is turned off, and the parasitic capacitance may impact the performance of LNA 760 when it is enabled. The impact due to the parasitic capacitance of shunt switch 730 may increase at higher frequency. Hence, LNA 760 may be designed to account for the parasitic capacitance of shunt switch 730.

In an exemplary design, LNAs for different bands may be implemented with separate circuits, e.g., as shown in FIG. 3. The isolation between these LNAs may then be dependent on the coupling between the LNAs, e.g., between the I/O pads of the LNAs, as shown in FIG. 3. In another exemplary design, LNAs for different bands may share one or more circuit components (e.g., a source degeneration inductor) in order to reduce component count, circuit area, and cost. The isolation between these LNAs may be dependent on coupling via the share circuit component(s).

Figure 8A:
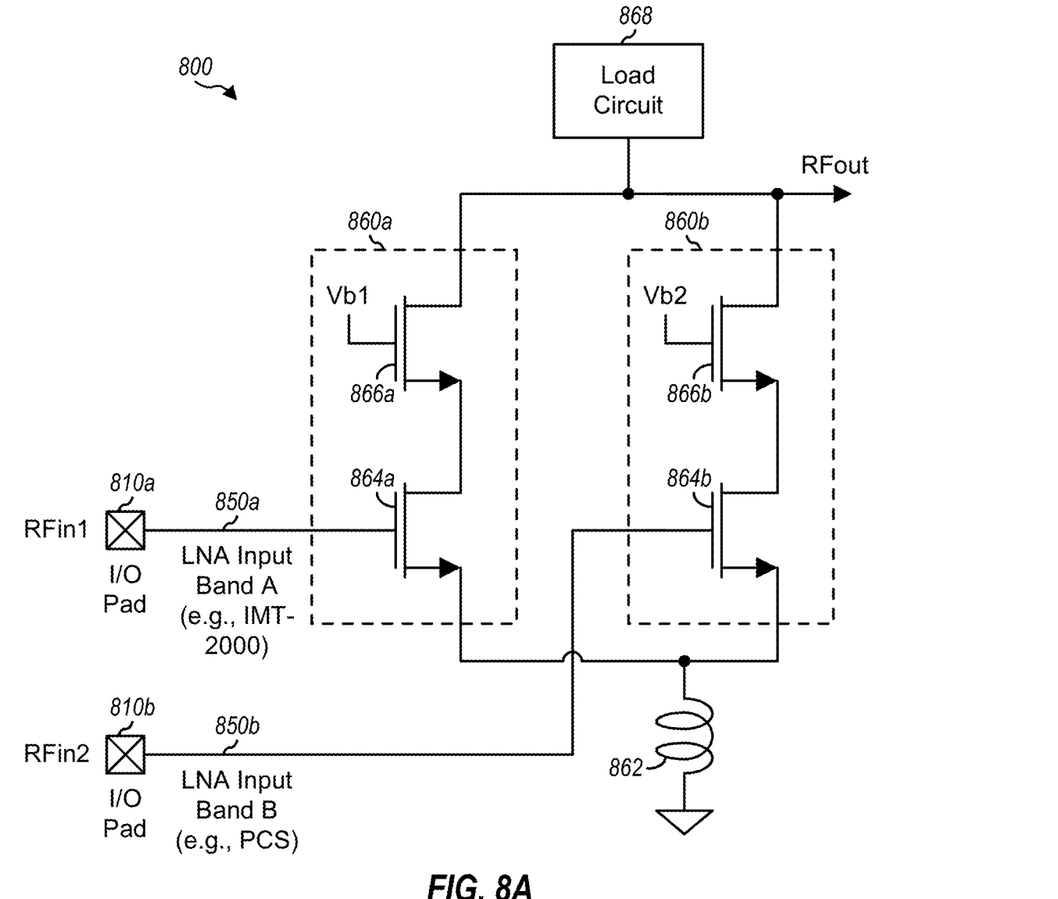

FIG. 8A shows an exemplary design of a receiver 800 with two LNAs 860a and 860b sharing a source degeneration inductor 862 and a load circuit 868. LNA 860a covers band A (e.g., IMT-2000 band) and includes a gain NMOS transistor 864a and a cascode NMOS transistor 866a, which are coupled as shown in FIG. 8A. LNA 860b covers band B (e.g., PCS band) and includes a gain NMOS transistor 864b and a cascode NMOS transistor 866b, which are coupled as shown in FIG. 8A. Inductor 862 has one end coupled to the sources of gain transistors 864a and 864b and the other end coupled to circuit ground. Load circuit 868 is coupled to the drains of cascode transistors 866a and 866b. The gate of gain transistor 864a corresponds to an LNA input 850a of LNA 860a and is coupled to an I/O pad 810a. The gate of gain transistor 864b corresponds to an LNA input 850b of LNA 860b and is coupled to an I/O pad 810b. The drains of cascode transistors 866a and 866b are coupled together and provide an output RF signal (RFout) for LNA 860a or 860b.

Either LNA 860a or 860b may be enabled at any given moment. If band A is selected, then LNA 860a is enabled, and LNA 860b is disabled. LNA 860a then receives a first input RF signal (RFin1) via I/O pad 810a and provides an output RF signal (RFout). Even though LNA 860b is disabled (e.g., by turning off transistors 864b and 866b), a second input RF signal (RFin2) from I/O pad 810b may be coupled via gain transistor 864b and would then appear at inductor 862 and act as interference to the first input RF signal. Conversely, if band B is selected, then LNA 860b is enabled, and LNA 860a is disabled. LNA 860b then receives the second input RF signal via I/O pad 810b and provides an output RF signal. Even though LNA 860a is disabled (e.g., by turning off transistors 864a and 866a), the first input RF signal from I/O pad 810a may be coupled via gain transistor 864a and would then appear at inductor 862 and act as interference to the second input RF signal.

Figure 8B:
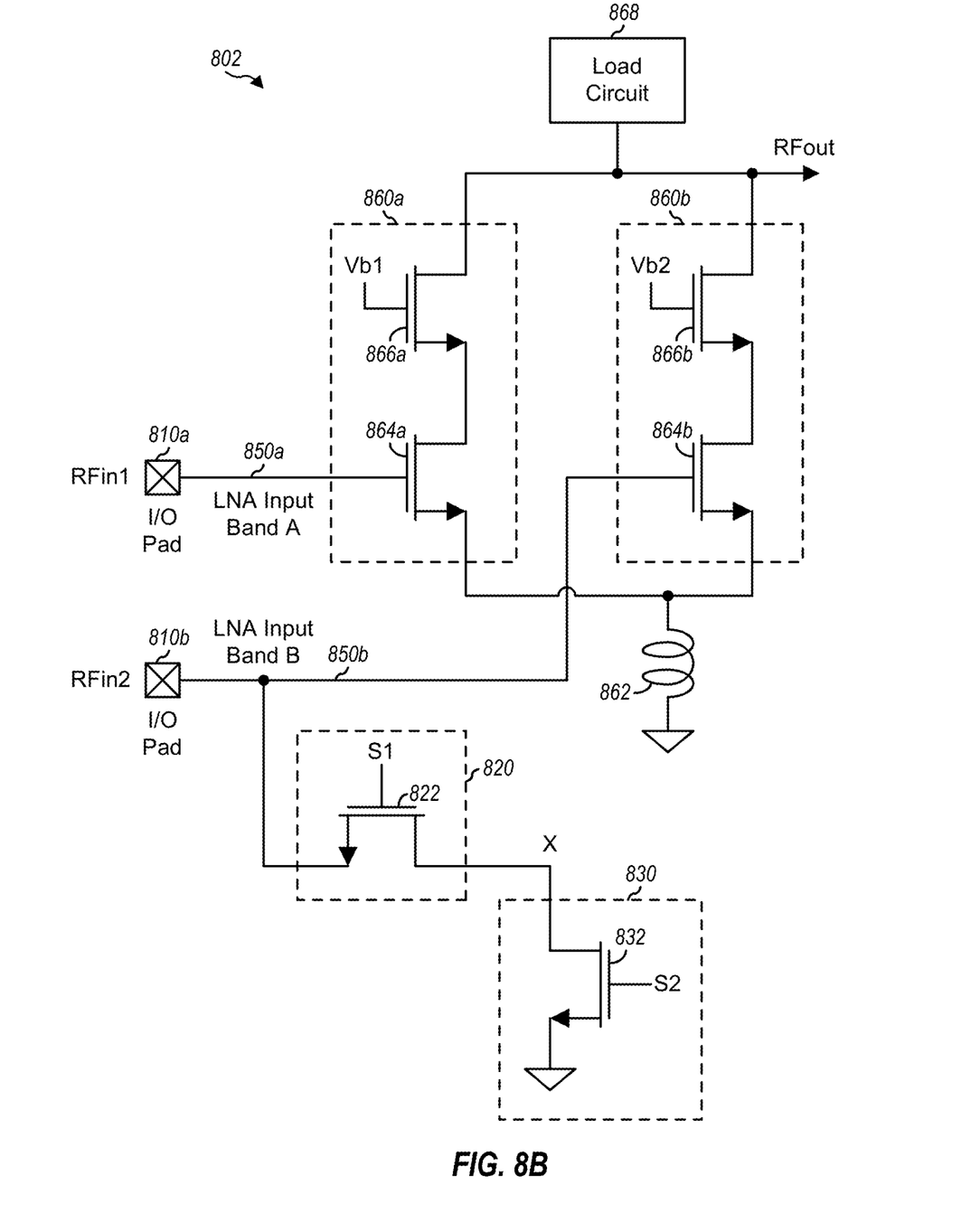

FIG. 8B shows an exemplary design of a receiver 802 with two LNAs 860a and 860b sharing source degeneration inductor 862 and load circuit 868 and implementing the second circuit topology in FIG. 4B. Receiver 802 includes LNA 860a for band A and LNA 860b for band B, as described above for FIG. 8A. Receiver 802 further includes (i) a circuit 820 coupled between I/O pad 810b and node X and (ii) a shunt switch 830 coupled between node X and circuit ground. Circuit 820 comprises an NMOS transistor 822 operating as a series switch and is coupled between I/O pad 810b and node X. Shunt switch 830 comprises an NMOS transistor 832 coupled between node X and circuit ground.

The exemplary design in FIG. 8B includes series switch 820 and shunt switch 830 that can mitigate TX jammers from a transmitter for band A (e.g., IMT-2000 band), which overlaps with band B (e.g., PCS band). A series switch and a shunt switch may be used to mitigate TX jammers from a transmitter for band B and may be coupled to I/O pad 810a in similar manner as series switch 820 and shunt switch 830 to I/O pad 810b.

Receiver 802 operates as follows. When band A is selected, LNA 860a is enabled, LNA 860b is disabled, and series switch 820 and shunt switch 830 are both closed. LNA 860a receives the first input RF signal via I/O pad 810a and provides an output RF signal. Since series switch 820 and shunt switch 830 are closed, the second input RF signal from I/O pad 810b is shorted to circuit ground and causes little interference to the first input RF signal. Conversely, when band B is selected, LNA 860b is enabled, LNA 860a is disabled, and series switch 820 and shunt switch 830 are both opened. LNA 860b receives the second input RF signal via I/O pad 810b and provides an output RF signal.

In one exemplary design, LNA 860b may be a high-gain LNA for band B. Receiver 802 may include a low-gain LNA for band B having its input coupled to node X, e.g., as shown in FIG. 6. The high-gain LNA may be implemented in similar manners as LNA 760 in FIG. 7. The low-gain LNA may be implemented with circuit 540 and LNA 560 in FIG. 5. The high-gain LNA and low-gain LNA may also be implemented in other manners.

As described above, low-band, mid-band, and high-band may each include a number of bands. Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101.

A wireless device may support carrier aggregation, which is operation on multiple carriers. Carrier aggregation may also be referred to as multi-carrier operation. The wireless device may be configured with up to 5 carriers in one or two bands for carrier aggregation in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 9A:
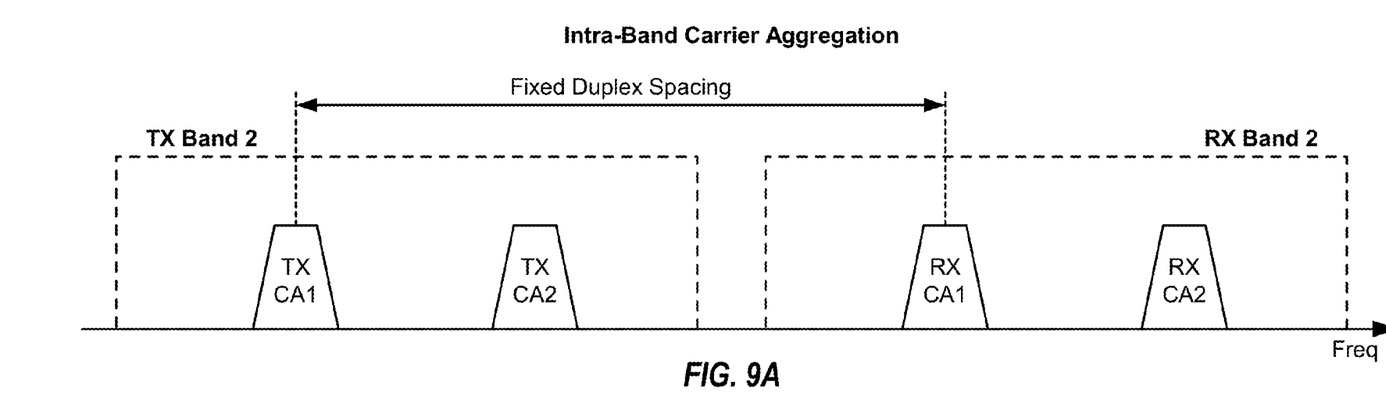
FIGS. 9A and 9B show two examples of carrier aggregation.

FIG. 9A shows an example of intra-band CA. In the example shown in FIG. 9A, a wireless device is configured with two carriers CA1 and CA2 in the same band, which is Band 2 or PCS band. For FDD, each carrier is associated with a transmit frequency channel and a receive frequency channel, which are separated by a fixed duplex spacing defined for the band in which the carrier belongs. The wireless device may send and receive transmissions on carriers CA1 and CA2 within the same band.

Figure 9B:
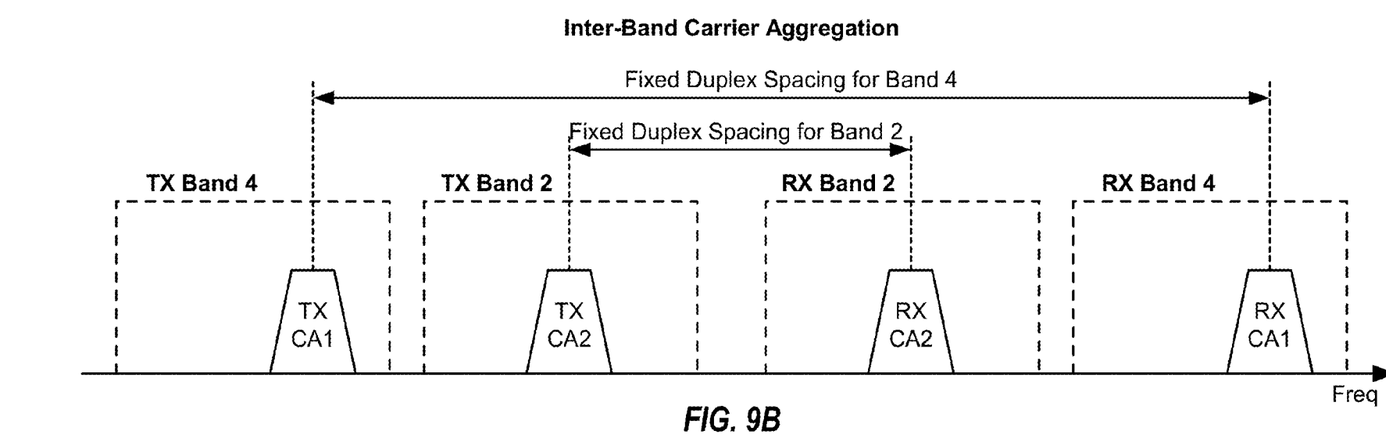

FIG. 9B shows an example of inter-band CA. In the example shown in FIG. 9B, a wireless device is configured with two carriers in different bands, which include carrier CA1 in Band 2 and carrier CA2 in Band 4. The wireless device may send and receive transmissions on carriers CA1 and CA2 in different bands.

FIGS. 9A and 9B show two examples of intra-band CA and inter-band CA. Intra-band CA and inter-band CA may also be supported for other combinations of bands and band groups.

For intra-band CA, if a transmit frequency channel of a given carrier C overlaps a receive frequency channel of a band Q supported by the wireless device, then a transmit RF signal for carrier C may appear at the input of a disabled LNA for band Q. The transmit RF signal may leak into the receive path for carrier C, and the leaked transmit RF signal may appear as a TX jammer, e.g., as shown in FIG. 3.

For inter-band CA, a transmit RF signal for one carrier CA1 may act as interference to a receiver for another carrier CA2 and may desensitize the receiver for carrier CA2. For both intra-band CA and inter-band CA, a first transmit RF signal for carrier CA1 and/or a second transmit RF signal for carrier CA2 may cause third-order intermodulation product (IMD3) to fall on a receive frequency channel for carrier CA1. The IMD3 may act as interference to an enabled LNA for carrier CA1. The interference caused by the leaked transmit RF signal may be more problematic if a leakage path through a disabled LNA is not sufficiently isolated from the enabled LNA. Carrier aggregation may be supported for a large number of bands, and it may be challenging to consider all possible desensitization and intermodulation distortion scenarios. Hence, shunt switches may be used for all LNAs, or just LNAs deemed to be more problematic in coupling interference, in order to improve the performance of the enabled LNAs.

LNAs to support intra-band CA and inter-band CA may be implemented in various manners. In an exemplary design, LNAs 860a and 860b in FIG. 8B may be used to receive two input RF signals for two bands. Either LNA 860a or 860b may be enabled to amplify its input RF signal and provide an output RF signal. In another exemplary design, LNAs 660 and 662 in FIG. 6 may be used to support one or more bands for intra-band CA and inter-band CA. Either high-gain LNA 660 or low-gain LNA 662 may be enabled to amplify an input RF signal and provide an output RF signal. Intra-band CA and inter-band CA may also be supported with LNAs implemented in other manners. Shunt switches may be used for the LNAs to mitigate coupling of interference from the disabled LNAs to the enabled LNAs.

A shunt switch that is isolated from both an I/O pad and an LNA input of a first LNA may be used to mitigate interference to a second LNA. The first LNA may be for a first band (e.g., PCS band) and the second LNA may be for a second band (e.g., IMT-2000 band). When the second band is selected, the shunt switch may improve the sensitivity of the second LNA in the presence of a TX jammer in the second band by shorting the TX jammer at the first LNA. When the first band is selected, the shunt switch may have negligible adverse impact on the performance of the first LNA since it is isolated from the I/O pad and the LNA input of the first LNA.

Performance of a receiver with two LNAs for two overlapping bands (e.g., IMT-2000 and PCS bands) was simulated with and without a shunt switch. The simulation indicates that the performance of the receiver may be improved by using the shunt switch.

Figure 10A:
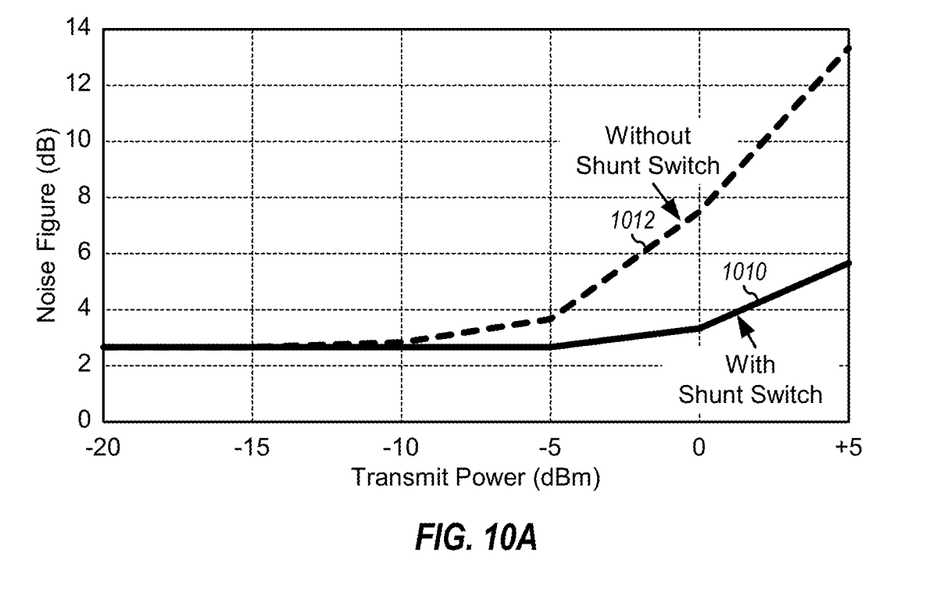
FIGS. 10A to 10C show improvement in performance with a shunt switch.

FIG. 10A shows noise figure (NF) of an enabled LNA (e.g., enabled LNA 360 for IMT-2000 band in FIG. 3) versus transmit power at a disabled LNA (e.g., disabled LNA 362 for PCS band in FIG. 3). The vertical axis shows noise figure in units of dB, with a lower noise figure being better. The horizontal axis shows transmit power at the input of the disabled LNA in units of dBm. A plot 1010 shows noise figure of the enabled LNA versus transmit power at the disabled LNA when a shunt switch is used for the disabled LNA and is closed. A plot 1012 shows noise figure of the enabled LNA versus transmit power at the disabled LNA when a shunt switch is not used for the disabled LNA. Plots 1010 and 1012 show the enabled LNA having significantly better noise figure at higher transmit power levels (e.g., greater than −5 dBm) when the shunt switch is used.

Figure 10B:
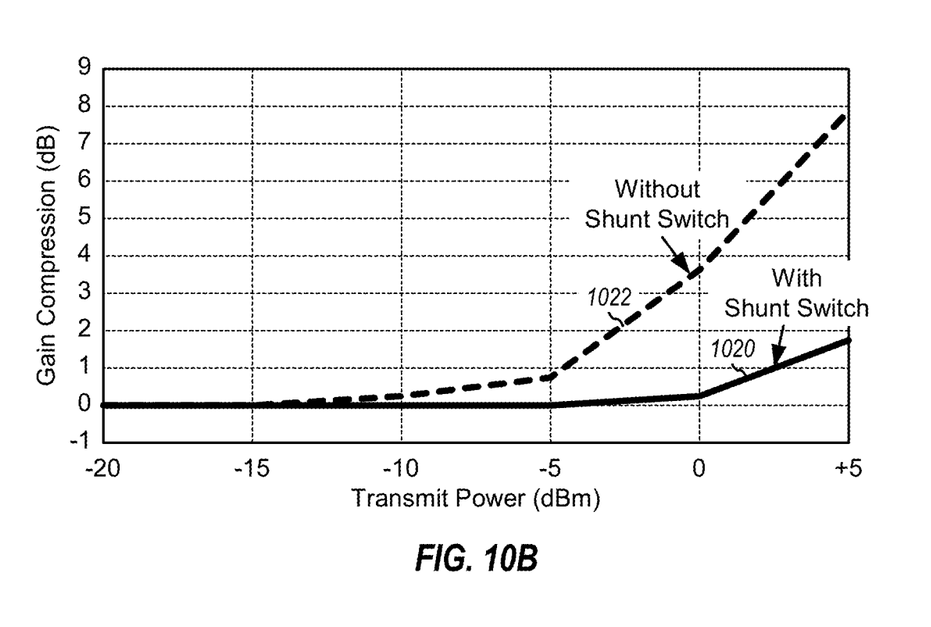

FIG. 10B shows gain compression of the enabled LNA versus transmit power at the disabled LNA. Strong TX jammers at the enabled LNA may cause saturation of the LNA, which may then reduce the gain of the LNA and result in gain compression. The vertical axis shows gain compression in units of dB, with less gain compression being better. The horizontal axis shows transmit power at the input of the disabled LNA in units of dBm. A plot 1020 shows gain compression of the enabled LNA versus transmit power at the disabled LNA when a shunt switch is used for the disabled LNA and is closed. A plot 1022 shows gain compression of the enabled LNA versus transmit power at the disabled LNA when a shunt switch is not used for the disabled LNA. Plots 1020 and 1022 show the enabled LNA having significantly less gain compression at higher transmit power levels (e.g., greater than −5 dBm) when the shunt switch is used.

Figure 10C:
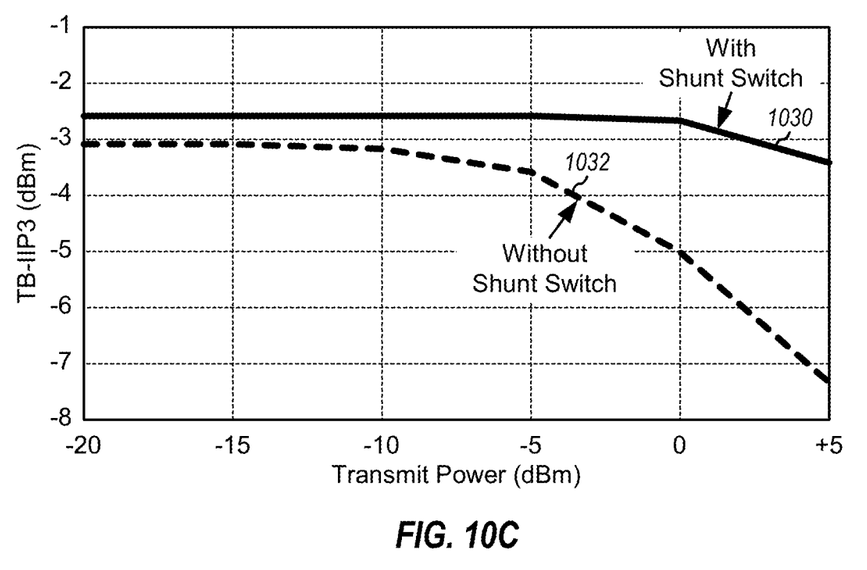

FIG. 10C shows triple beat input-inferred third-order interception point (TB-IIP3) of the enabled LNA versus transmit power at the disabled LNA. TB-IIP3 is related to cross-intermodulation between two TX jammers and one RX jammer and is a measure of linearity of an amplifier. The vertical axis shows TB-IIP3 in units of dBm, with higher TB-IIP3 being better. The horizontal axis shows transmit power at the input of the disabled LNA in units of dBm. A plot 1030 shows TB-IIP3 of the enabled LNA versus transmit power at the disabled LNA when a shunt switch is used for the disabled LNA and is closed. A plot 1032 shows TB-IIP3 of the enabled LNA versus transmit power at the disabled LNA when a shunt switch is not used for the disabled LNA. Plots 1030 and 1032 show the enabled LNA having better TB-IIP3 when the shunt switch is used.

In an exemplary design, an apparatus (e.g., a wireless device, an IC chip, a circuit module, etc.) may include an amplifier and a shunt switch. The amplifier (e.g., LNA 460 in FIGS. 4A to 4D) may have an amplifier input operatively (e.g., directly or indirectly) coupled to an I/O pad of an IC chip. The shunt switch (e.g., shunt switch 430 in FIGS. 4A to 4D) may be coupled between a node and circuit ground and may ground the amplifier when the shunt switch is closed. The amplifier is grounded by shorting the node to which the shunt switch is coupled to circuit ground, which may then inhibit the amplifier from causing interference to other circuits. The shunt switch may be isolated from the I/O pad and the amplifier input.

The amplifier may correspond to LNA 460 in FIGS. 4A to 4D. The amplifier may receive an input RF signal via the I/O pad and provide an output RF signal when the amplifier is enabled. The amplifier may also be an amplifier of some other type. The shunt switch may be isolated from the I/O pad by a first circuit, which may correspond to circuit 420 in FIGS. 4A to 4C or LNA 460 in FIG. 4D. The shunt switch may be isolated from the amplifier input by a second circuit, which may correspond to circuit 440 in FIG. 4A, circuit 420 in FIGS. 4B and 4C, or LNA 460 in FIG. 4D. The first circuit may be the same as the second circuit or may be different from the second circuit. In an exemplary design, the amplifier input may be coupled directly to the I/O pad, and the shunt switch may be isolated from the I/O pad and the amplifier input by the same circuit, e.g., as shown in FIGS. 4B to 4D.

In an exemplary design, a series switch (e.g., switch 520 in FIG. 5, switch 620 in FIG. 6, or switch 820 in FIG. 8B) may be coupled between the I/O pad and the shunt switch. The series switch and the shunt switch may be closed when the amplifier is disabled and may be opened when the amplifier is enabled.

In an exemplary design, a circuit may be coupled between the shunt switch and the amplifier input and may comprise at least one of a resistor divider network and an AC coupling capacitor, e.g., as shown in FIG. 5. In an exemplary design, the apparatus may further include a feedback circuit (e.g., circuit 470 in FIG. 4C) coupled between the shunt switch and an output of the amplifier.

In an exemplary design, the apparatus may further include a second amplifier having an input coupled to the shunt switch. The amplifier may be a high-gain amplifier (e.g., high-gain LNA 660 in FIG. 6). The second amplifier may be a low-gain amplifier (e.g., low-gain LNA 662 in FIG. 6) having a smaller gain than the high-gain amplifier. The shunt switch may be opened when the second amplifier is enabled and may be closed when the amplifier and the second amplifier are disabled.

In another exemplary design, the apparatus may further include a second amplifier having an input operatively coupled to a second I/O pad. The amplifier (e.g., LNA 810b in FIG. 8B) and the second amplifier (e.g., LNA 810a in FIG. 8B) may share a source degeneration inductor (e.g., inductor 862).

In an exemplary design, the amplifier may comprise a gain transistor (e.g., gain transistor 764 in FIG. 7). The shunt switch may be coupled between the drain of the gain transistor and ground, e.g., as shown in FIG. 7.

In an exemplary design, the amplifier may cover a first band (e.g., PCS band) that overlaps a second band (e.g., IMT-2000 band) supported by the apparatus. The shunt switch may be opened when the first band is selected and the amplifier is enabled. The shunt switch may be closed when the second band is selected and the amplifier is disabled.

In an exemplary design, the apparatus may support carrier aggregation. The amplifier may receive an input RF signal comprising transmissions sent on multiple carriers at different frequencies to the apparatus and may provide an output RF signal. The amplifier may be used to amplify the input RF signal for one or more carriers being received. The shunt switch may be closed when the amplifier is disabled. In another exemplary design, the amplifier is not used to receive an input RF signal for carrier aggregation. The shunt switch may be closed when the amplifier is disabled in order to mitigate interference to one or more amplifiers that are enabled to receive one or more input RF signals for carrier aggregation.

In another exemplary design, an apparatus (e.g., a wireless device, an IC chip, a circuit module, etc.) may include an amplifier, a series switch, and a shunt switch. The amplifier may have an amplifier input coupled to an I/O pad of an IC chip. The amplifier may comprise an LNA or some other type of amplifier. The series switch may be coupled between the I/O pad and a node. The shunt switch may be coupled between the node and circuit ground and may be isolated from the I/O pad and the amplifier input by the series switch.

Figure 11:
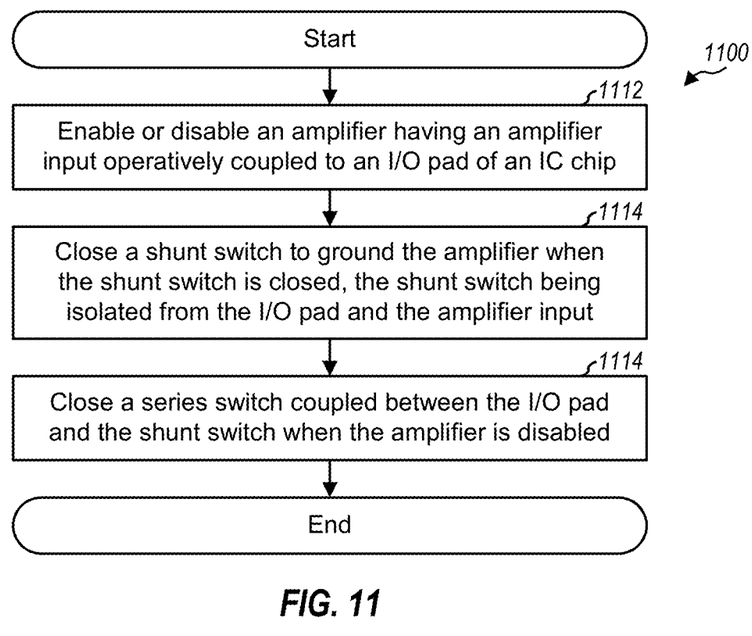
FIG. 11 shows a process for controlling an amplifier.

FIG. 11 shows an exemplary design of a process 1100 for controlling an amplifier. Process 1100 may be performed by a wireless device or by some other entity. An amplifier having an amplifier input operatively coupled to an I/O pad of an IC chip may be enabled or disabled (block 1112). A shunt switch may ground the amplifier when the shunt switch is closed (block 1114). The shunt switch may be isolated from the I/O pad and the amplifier input. In an exemplary design, the shunt switch may be isolated from the I/O pad by a series switch, which may be closed when the amplifier is disabled (block 1116).

The amplifiers with shunt switches described herein may be implemented on an IC, an analog IC, an RFIC, a mixed-signal IC, an ASIC, a printed circuit board (PCB), an electronic device, etc. The amplifiers with shunt switches may be fabricated with various IC process technologies such as complementary metal oxide semiconductor (CMOS), NMOS, P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the amplifiers with shunt switches described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
    an amplifier for amplifying an radio frequency (RF) input signal having an amplifier input operatively coupled to an input/output (I/O) pad of an integrated circuit (IC) chip; and
    a shunt switch configured to ground the amplifier input configured to receive the RF input signal when the shunt switch is closed, the shunt switch being isolated from the I/O pad and the amplifier input.

2. The apparatus of claim 1, further comprising:
    a series switch coupled between the I/O pad and the shunt switch.

3. The apparatus of claim 2, the series switch and the shunt switch being closed when the amplifier is disabled, and the series switch and the shunt switch being opened when the amplifier is enabled.

4. The apparatus of claim 1, further comprising:
    a circuit coupled between the shunt switch and the amplifier input and comprising at least one of a resistor divider network or an AC coupling capacitor.

5. The apparatus of claim 1, the amplifier input being coupled directly to the I/O pad.

6. The apparatus of claim 1, further comprising:
    a second amplifier having an input coupled to the shunt switch.

7. The apparatus of claim 6, the amplifier corresponding to a high-gain amplifier, and the second amplifier corresponding to a low-gain amplifier having a smaller gain than the high-gain amplifier.

8. The apparatus of claim 6, the shunt switch being opened when the second amplifier is enabled and being closed when the amplifier and the second amplifier are disabled.

9. The apparatus of claim 1, further comprising:
    a second amplifier having an input operatively coupled to a second I/O pad, the amplifier and the second amplifier sharing a source degeneration inductor.

10. The apparatus of claim 1, further comprising:
    a feedback circuit coupled between the shunt switch and an output of the amplifier.

11. The apparatus of claim 1, the amplifier covering a first band overlapping a second band supported by the apparatus, the shunt switch being opened when the first band is selected and the amplifier is enabled, and the shunt switch being closed when the second band is selected and the amplifier is disabled.

12. The apparatus of claim 1, the amplifier configured to receive an input radio frequency (RF) signal comprising transmissions sent on multiple carriers at different frequencies to the apparatus and provide an output RF signal.

13. The apparatus of claim 1, the amplifier comprising a low noise amplifier (LNA) configured to receive an input radio frequency (RF) signal via the I/O pad and provide an output RF signal when the LNA is enabled.

14. An apparatus comprising:
    an amplifier for amplifying an radio frequency (RF) input signal having an amplifier input coupled to an input/output (I/O) pad of an integrated circuit (IC) chip;
    a series switch coupled between the I/O pad and a node; and
    a shunt switch configured to ground the amplifier input configured to receive the RF input signal and coupled between the node and circuit ground, the shunt switch being isolated from the I/O pad and the amplifier input by the series switch.

15. A method comprising:
    enabling or disabling an amplifier for amplifying an radio frequency (RF) input signal having an amplifier input operatively coupled to an input/output (I/O) pad of an integrated circuit (IC) chip; and
    closing a shunt switch configured to ground the amplifier input configured to receive the RF input signal when the shunt switch is closed, the shunt switch being isolated from the I/O pad and the amplifier input.

16. The method of claim 15, further comprising:
    closing a series switch coupled between the I/O pad and the shunt switch when the amplifier is disabled.

17. An apparatus comprising:
    means for amplifying an radio frequency (RF) input signal having an input and configured to receive the RF input signal via an input/output (I/O) pad of an integrated circuit (IC) chip; and
    means for switching configured to ground the input configured to receive the RF input signal of the means for amplifying when the means for switching is closed, the means for switching being isolated from the I/O pad and the input of the means for amplifying.

18. The apparatus of claim 17, further comprising:
a second means for switching configured to short the means for switching to the I/O pad when the second means for switching is closed.

* * * * *